United States Patent [19]

Thoen

[11] Patent Number: 5,068,813
[45] Date of Patent: Nov. 26, 1991

[54] PHASED DIGITAL FILTERING IN MULTICHANNEL ENVIRONMENT

[75] Inventor: Bradford K. Thoen, Eden Prairie, Minn.

[73] Assignee: MTS Systems Corporation, Minneapolis, Minn.

[21] Appl. No.: 432,545

[22] Filed: Nov. 7, 1989

[51] Int. Cl.$^5$ .............................................. H04J 15/00
[52] U.S. Cl. ................................ 364/572; 364/724.1; 341/122; 307/241; 370/112; 370/123
[58] Field of Search ............... 364/572, 724.1, 178, 364/179; 341/122, 123; 370/69.1, 72, 73, 112, 123; 307/243, 241; 328/104

[56] References Cited

U.S. PATENT DOCUMENTS

| | | | |
|---|---|---|---|
| 2,521,229 | 9/1950 | Koch | 370/112 |
| 3,632,905 | 1/1972 | Thomas | 379/410 |
| 3,699,325 | 10/1972 | Montgomery, Jr. et al. | 341/122 X |
| 3,988,607 | 10/1976 | Eggermont et al. | 364/724.1 |
| 3,997,773 | 12/1976 | Van Essen et al. | 364/723 |
| 4,020,332 | 4/1977 | Crochiere et al. | 364/723 |
| 4,257,100 | 3/1981 | Syrbe et al. | 364/200 |
| 4,318,086 | 3/1982 | Peek et al. | 341/156 |
| 4,344,149 | 8/1982 | van de Meeberg et al. | 364/724 |
| 4,368,434 | 1/1983 | Miller et al. | 329/50 |
| 4,419,897 | 12/1983 | Matsuoka | 73/660 |
| 4,606,051 | 8/1986 | Crabtree et al. | 375/86 |
| 4,612,625 | 9/1986 | Bertrand | 364/724 |
| 4,616,358 | 10/1986 | Rehm et al. | 370/112 X |
| 4,689,759 | 8/1987 | Anouar et al. | 364/572 |
| 4,706,239 | 11/1987 | Ito et al. | 370/123 X |
| 4,709,394 | 11/1987 | Bessler et al. | 382/49 |
| 4,725,972 | 2/1988 | Göckler | 364/724 |
| 4,766,562 | 8/1988 | Vary | 364/724 |
| 4,782,324 | 11/1988 | Underwood | 341/147 |
| 4,790,015 | 12/1988 | Callens et al. | 381/31 |
| 4,799,179 | 1/1989 | Masson et al. | 364/724.1 |
| 4,802,098 | 1/1989 | Hansen et al. | 364/487 |
| 4,809,208 | 2/1989 | Hansen et al. | 364/724.12 |
| 4,835,723 | 5/1989 | Hansen | 364/724.01 |
| 4,835,725 | 5/1989 | Yassaie et al. | 364/736 |
| 4,839,889 | 6/1989 | Gockler | 370/70 |

OTHER PUBLICATIONS

Sheingold, D. H., *Analog-Digital Conversion Handbook*, Prentice-Hall, 1986, pp. 32-37.

Primary Examiner—Joseph L. Dixon

[57] ABSTRACT

Parallel multistage, multirate digital filters are executed by a digital signal processor for signals on a plurality of channels. Parallel signals are converted from a first sampling frequency to a second sampling frequency by applying the signal from each channel to one of the substantially identical multistage, multirate digital filters. Each stage of each multistage, multirate digital filter includes a plurality of subfilters and a commutator for indicating a subfilter for execution. The commutators index at the same frequency for like stages of each multistage, multirate digital filters. Initial commutator positions are staggered between multistage, multirate digital filters at at least the highest rate stage. Variable delay lines may be included in each channel to compensate for interchannel data skew introduced by commutator staggering.

12 Claims, 4 Drawing Sheets

PHASED DIGITAL FILTERING IN MULTICHANNEL ENVIRONMENT

BACKGROUND OF THE INVENTION

1. Field of the Invention

The present invention relates to digital signal processing, and more particularly, to a digital signal processing system providing reception and transmission of signals on multiple channels in a simulation testing system.

2. Description of the Prior Art

Simulation testing provides laboratory reproduction of conditions to which a product or material may be exposed in real world use, typically in a compressed time period. An example of such testing is the application of vibration to a test specimen. Sensors or transducers measure continuously, and in real time, motion of, force on and strain on the specimen. In the testing of automobiles, force and motion vectors analogous to those imposed on the automobile when it travels over a road surface are recreated. The testing is used to determine chassis and body fatigue endurance, and to evaluate vehicle noise and vibration under simulated road conditions. Continuing test results are used as feedback to modify the test. Simulation testing is both quicker than conventional testing and can be more precisely directed to an area of interest, for example, fatigue analysis. Engineers control monitoring and testing through appropriately programmed digital computers.

The transducers used to measure the vibration and stress experienced by the specimen typically generate analog output signals. Such output signals must be converted to binary digital signals for use by data processing equipment. The output signals are converted to binary digital signals by analog to digital ("A/D") converters. The digital output signals from the A/D converter are passed to a digital signal processor.

The digital signal processor also processes digital actuation signals for control of the mechanisms used for application of motion to the test specimen. The signals typically control the positioning of valves in hydraulic or like mechanisms.

A digital signal processor is a specialized type of microprocessor which is used to manipulate data before it is transmitted to a computer for analysis. It is used for multirate, multistage digital filtering. The filters are referred to as multirate because they change the data sampling rate at each stage. They are multistage filters because the change in sampling rate is done over a plurality of discrete filtering stages. The digital signal processor also processes digital control signals generated by an analysis computer before transmission to motion generating mechanisms. In the present invention, as well as in prior art systems, digital signal processing is used to decimate an incoming data stream to reduce the rate at which data is provided the data analysis computer. Signal decimation, i.e. the reduction in tee number of data points being provided by an A/D converter, is required because the A/D converter will typically provide data points at a rate faster than the computer can accept.

Reduction in the rate of sampling by the A/D converter of an incoming analog signal is typically not desirable. Analog signals are signals of continuously varying value. Digital computers can operate only on discrete representations of the value of the analog signal as it varies over time. Accordingly, the incoming analog signal must be sample periodically to provide the computer discrete value representations of the analog signal. Sampling is the process of obtaining a sequence of instantaneous values of a waveform, typically at regular time intervals. Sampling must occur frequently enough to avoid generating a false representation of the analog signal, a phenomenon known as aliasing. The rate at which the signal is sampled is the sampling frequency. If a signal has a frequency spectrum of band B, the sampling frequency of the A/D converter must exceed 2B. An A/D converter operating at such a frequency will, in many simulation testing systems, generate data points faster than the computer can use them.

The digital signal processor decimates the data flow from the A/D computer in a fashion that preserves enough information to substantially reconstruct, for data processing purposes, the analog output signal of a transducer while generating output data at a rate that the computer operating on the data can accept. The digital signal processor passes the decimated signal on to the data analyzing computer. While the techniques for signal decimation on a single channel of data are well known, extension of these techniques to multiple channels can lead to difficulties.

Decimation of signals in digital signal processors is preferably done through multirate, multistage digital filters executed by the digital signal processor. Staging providing piecemeal, stepped reduction in frequency reduces computational burdens on the digital signal processor. Nonetheless, certain stages of the multistage filters make heavy computational demands on the machine. Decimation of signals on multiple parallel channels by a digital signal processor can lead to overloading of the digital signal processor, and to the consequent use of more than one digital signal processor to provide for large numbers of channels.

The. digital signal processor is also used, both in the prior art and in the present invention, to process control signals generated by the computer for the actuation of the hydraulic valves controlling the motion applied to the test specimen. It is frequently desirable to interpolate the control signals to smooth the output of the digital to analog converter which is used for actual control of the valves. The term sampling frequency will also be used in this patent to refer to the outputs of stages of an interpolation or upsampling filter operation executed by the digital signal processor. Interpolation or upsampling is the generation of data points intermediate in time to changes in value of the signal to be upsampled, with a value functionally related to two or more values of the digital signal to be upsampled. Where multiple channels are to be upsampled, digital signal processors have been used to execute a plurality of multirate, multistage digital filters in parallel on the channels. This has led to overloading of digital signal processors.

SUMMARY OF THE INVENTION

A specimen, such as automobile, being subjected to simulated road conditions, is mounted at its wheels or wheel spindles on supports through which multidirectional motion is applied to the vehicle. The supports are moved by motion actuators which respond to analog command signals. Transducers attached to the automobile develop analog output signals relating to motion, force, strain, and other measurable factors. A plurality of transmission channels are provided for the transmission of transducer outputs and analog command signals, generally with a channel being associated each transducer and each motion actuator.

A digital signal processor provides for decimation of the transducer output signals, after analog to digital conversion, and for interpolation of the motion actuator command signals, which are subject to digital to analog conversion. The digital signal processor executes parallel multistage, multirate digital filters on incoming signals representing the outputs of the transducers. The digital data streams on each channel are digitally filtered, preferably by execution of appropriate commutator routines in the digital filter for each channel, resulting in a decimated representation of the analog output signal for each channel. Commutator operations are phase staggered between channels to avoid coincidence of mathematical processing demands on the digital signal processor. Decimated digital data signals are transferred to a data analysis computer.

The digital signal processor also provides for interpolation of analysis computer control signals and transmission of the interpolated signals onto the channels to the motion actuators. Again, the digital signal processor executes parallel multistage, multirate digital filters on the command signals generated by the analysis computer. Commutators in the digital filters are staggered in phase from channel to channel, again to avoid coincidence of certain subfilter operations between channels.

The digital signal processor, through a digital to analog converter transmits the data point enhanced analog servo command signals out to actuators, such as servohydraulic actuators, for carrying out the simulation regimen employed to the specimen.

Variable delay lines may be included in each channel to compensate for interchannel data skew introduced by staggered phasing of the commutators of the digital filters.

DETAILED DESCRIPTION OF THE PREFERRED EMBODIMENTS

Figure 1:
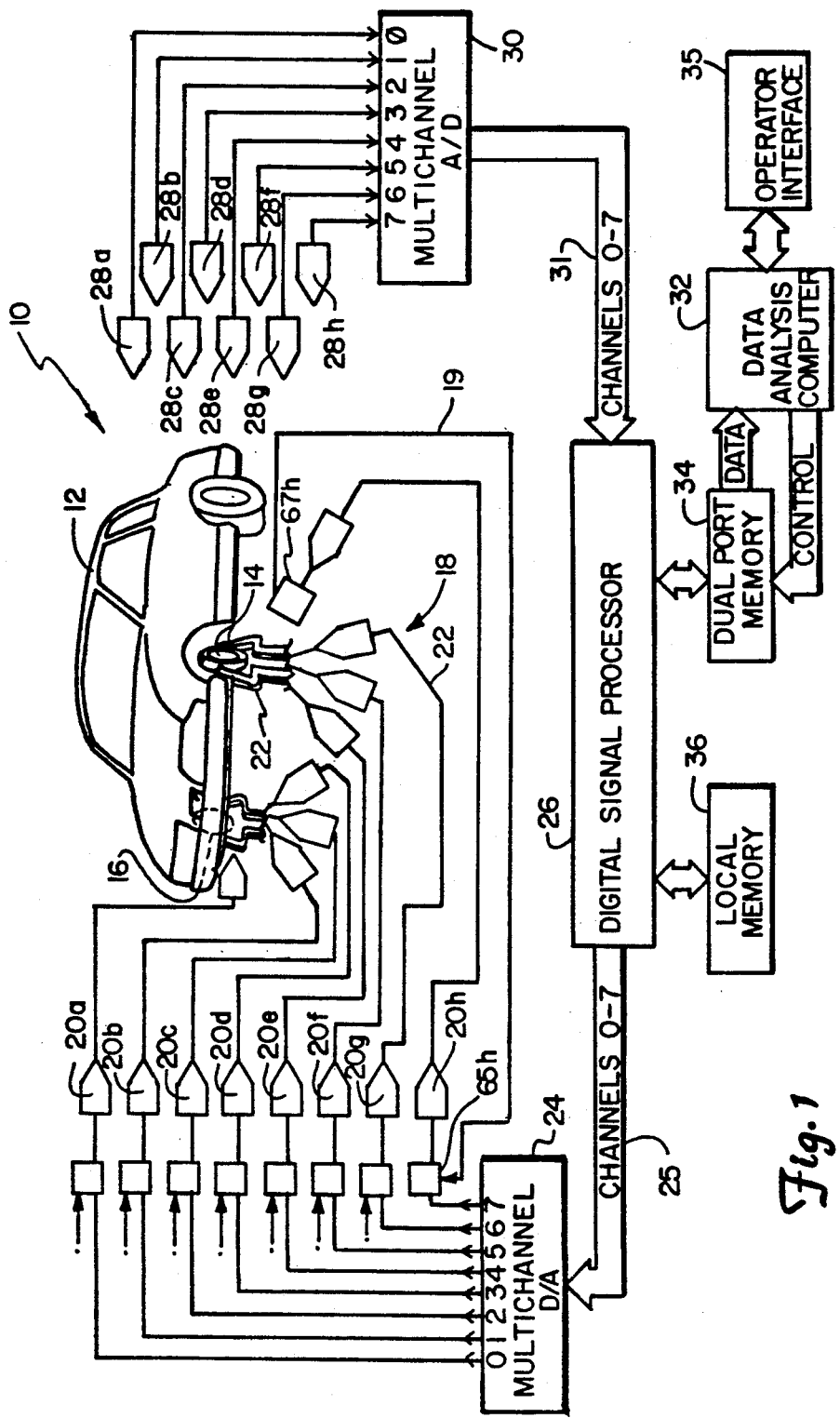
FIG. 1 is a block diagram of a multichannel simulation testing system.

FIG. 1 illustrates a simulation testing apparatus 10 with which the present invention is advantageously applied. An automobile 12 is mounted by its front wheel spindles 14 and 16 on an actuation frame 22 of a motion simulation mechanism. Motion simulation mechanism 18 simulates road conditions for an automobile 12 undergoing testing. The simulation is induced through four principal motion and force inputs: vertical, lateral, longitudinal and torsional (e.g. braking). These inputs are produced by a plurality of servo controlled hydraulic actuators 20a through 20h, which are attached to actuation frame 22. Transducers 28a-28h attached to automobile 12 or between the automobile and frame develop analog output signals relating to motion, force, stain, and other measurable factors.

Each of servohydraulic actuators 20a-20h is part of an analog servo loop (only the servo loop for channel "7" is shown for the sake of simplicity). Servo loop 19 includes servohydraulic actuator 20h, a transducer 67h and an analog servo controller 65h. Each of analog servo controllers 65a-65h receives an analog command signal from a multichannel digital to analog (D/A) converter 24 over its respective channel (0-7). A servo actuation signal is generated by analog servo controller 65h and transmitted to servohydraulic actuator 20h. Transducer 67h, positioned between actuator 20h and wheel spindle 14, provides feedback response information the analog servo command signal.

The analog command signals are converted from digital control signals transmitted to D/A converter 24 on channels 0 through 7 over transmission line 25 from digital signal processor 26. The digital control signals are the product of programmed processing of transducer input signals from transducers 28a-28h and operator inputs from operator interface 35.

Transducers 28a-28h are a variety of sensors applied to automobile 12. Transducers 28a-28h may double as transducers in the analog servo loops (e.g. one transducer serving as both unit 28h and one of units 67a through 67h). Transducers 28a-28h generate a plurality of analog output signals which are transmitted onto channels 0 through 7 of system 10. The analog output signals are converted to digital data signals by multichannel analog to digital (A/D) converter 30 and transmitted to digital signal processor over transmission line 31. While the preferred embodiment is shown as having eight channels for data gathering and eight channels for actuation of movement, there is no requirement that the numbers of channels for sensing and actuation be the same.

Digital signal processor 26 is, in the preferred embodiment, an ADSP2100 digital signal processor available from Analog Devices Digital signal processor 26 communicates with a data analysis computer 32, which is operated through an operator interface 35. Data signals from analog to digital converter 30 are received by digital signal processor 26 which downsamples (i.e. decimates) the data stream. Digital signal processor 26 then transmits the downsampled data stream onto data analysis computer 32 by way of a dual port memory 34. Data analysis computer 32 develops control signals from operator inputs over operator interface 35 or as results from the analysis of incoming data and transmits the control signals to digital signal processor 26 through dual port memory 34. Digital signal processor 26 also utilizes a local memory 36 for the storage of intermediate values during calculations as well as digital filtering programming. The ADSP2100 as available from the manufacturer can handle as many as 17 channels, depending upon incoming data rates.

Multirate filtering is well known in the art of digital filters. See, for example, Crochiere & Rabiner, *Multirate Digital Signal Processing*, Prentice-Hall, 1983. Engineers commonly employ digital signal processors for data sampling rate conversion, including sampling rate reduction ("downsampling" or "decimation"), sampling rate expansion ("upsampling" or "interpolation") and low pass filtering. The basic commutator model for a single channel, illustrated in FIGS. 2A and B, and discussed below, is set forth in the above reference.

Figure 2A:
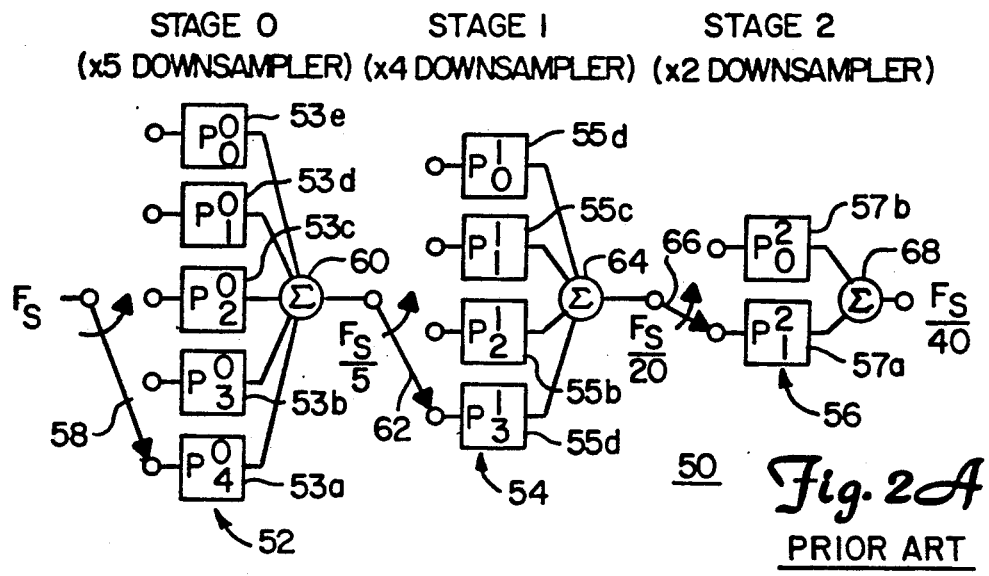
FIGS. 2A and 2B are flow charts for downsampling and upsampling digital filters.
Figure 2B:
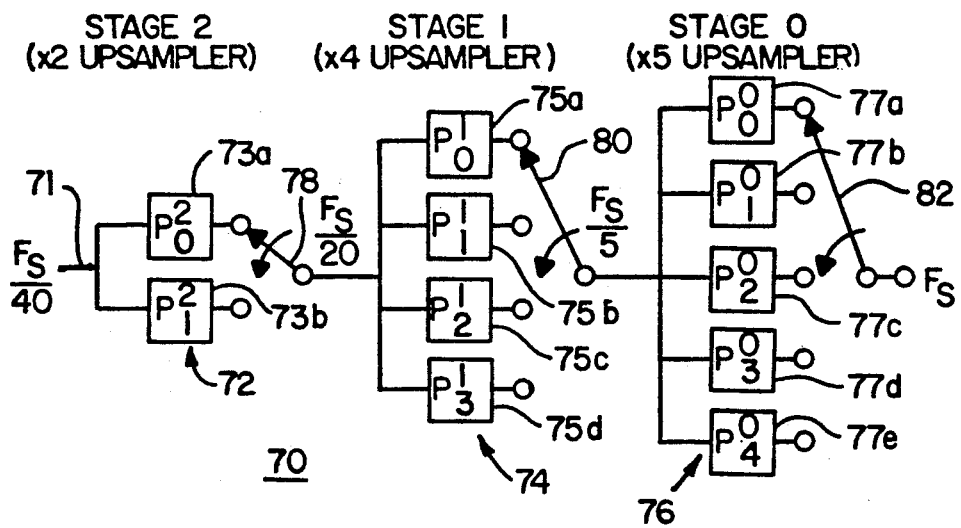

FIGS. 2A and 2B illustrate a downsampling digital filter and an upsampling digital filter, respectively. A multistage, multirate downsampling digital filter 50 operates on an incoming data signal having a sampling frequency of $F_s$. Downsampling digital filter has a plurality of subfilters in each of three downsampling stages 52, 54 and 56. A plurality of stages are used for converting the sampling frequency $F_s$ to a desired end frequency to reduce the computational burden involved in executing a software routine simulating a finite impulse response filter Each of stages 52, 54 and 56 includes at least two subfilters, stage 52 including subfilters 53a-53e, stage 54 having subfilters 55a-55d and state 56 having subfilters 57a and 57b. Incoming data having a sampling frequency of $F_S$ is directed to subfilters 53a-53e by a commutator 58, which cycles through the subfilters successively, i.e. from 53e to 53a and returning to 53e and is indexed one click or position at the sample frequency $F_s$.

The sum of the outputs of the subfilters of stage 52 is completed by summing junction 60 once each cycle, generating an output which changes with a frequency of $F_s/5$. Commutator 62 clocks through one of subfilters 55a-55d of stage 54 at a frequency of $F_s/5$. The outputs of subfilters 55a-55d are summed at summing junction 64 once each cycle of commutator 62 through the subfilters of stage 54, resulting in an output data signal with a frequency of $F_s/20$. This signal is passed by commutator 66 to subfilters 57a and 57b of stage 56, between which the commutator oscillates at a frequency of $F_s/20$. The summing of the outputs of the subfilters 57a and 57b is completed at summing junction 68 once each cycle of commutator 66 through the subfilters of stage 56, producing a decimated data output signal with a frequency of $F_s/40$. The decimated output signal then is usable by a data analysis computer, or other electronic equipment. FIG. 2b illustrates a three stage upsampling or interpolation subfilter 70. Stage 72 doubles the frequency from $F_s/40$ to $F_s/20$, stage 74 quadruples the sampling frequency of the output of stage 72 to $F_s/5$, stage 76 quintuples the output of stage 74 from $F_s/5$ to $F_s$. Data enters filter 70 from node 71, but the filter executes on the signal beginning at stage 76. A data sample entering any stage is available to all subfilters of the stage (subfilters 73a and 73b for stage 72, subfilters 75a-75d for stage 74 and subfilters 77a-77e for stage 76) simultaneously. However, only those subfilters to which a commutator points executes on the data sample, e.g. subfilter 73a executes when commutator 78 points to it, subfilter 75a executes when commutator 80 points to it, and subfilter 77a executes when commutator 82 points to it. When all subfilters within a stage have executed upon an input sample, the commutator flips over and another data point is requested from the preceding stage, causing that stage to execute.

For either upsampling filter 70 or downsampling filter 50, during any given sampling interval, a variable number of stages execute, depending on the orientation of the commutators. Execution of a subfilter is triggered by a change in commutator positioning. Taking downsampling filter 50 as an example, a subfilter in stage 52 executes every sampling interval, a subfilter in stage 54 executes once every five sampling intervals, and a subfilter in stage 56 executes once every 20 sampling intervals. Thus the computational loading of the processor varies from one sampling interval to the next with maximum loading occurring once every twenty intervals when three subfilters execute. The subfilters also differ in complexity and calculation time depending upon their location in the filter. Generally, the downstream subfilters found in stage 56 are more complex than the upstream subfilters found in stage 52. The general formula for worst case execution time T for a single multirate digital filter such as filter 50 is given by the formula:

$$T = \sum_{i=0}^{N_S-1} T_i$$

In the above formula $N_s$ is the number of stages and $T_i$ is the execution time for a filter of stage i. The maximum permissible time for execution of all subfilters is the duration of the sampling interval.

In selected prior art, multichannel filtering has been done through sets, or arrays of parallel digital filters, one digital filter being associated with each channel to be processed. Commutator positions between filters of the respective channels have mirrored one another, resulting in simultaneous occurrence of maximum computational burdens per channel on the signal processor executing the filters. This has resulted in a straight line increase in worst case execution time as a function of the number of channels $N_c$:

$$T = N_C \sum_{i=0}^{N_S-1} T_i$$

where $N_s$ is the number of stages and $T_i$ is the execution time for a filter of stage i. Worst case digital signal processor loading thus varies linearly with the number of channels. Only occasionally is the worst case loading experienced, and the processor operates at a fraction of its capacity most of the time. Again, this stems from identical phasing of the commutators across the channels, which results in the maximum computational loads for each channel occurring simultaneously.

Figure 3:
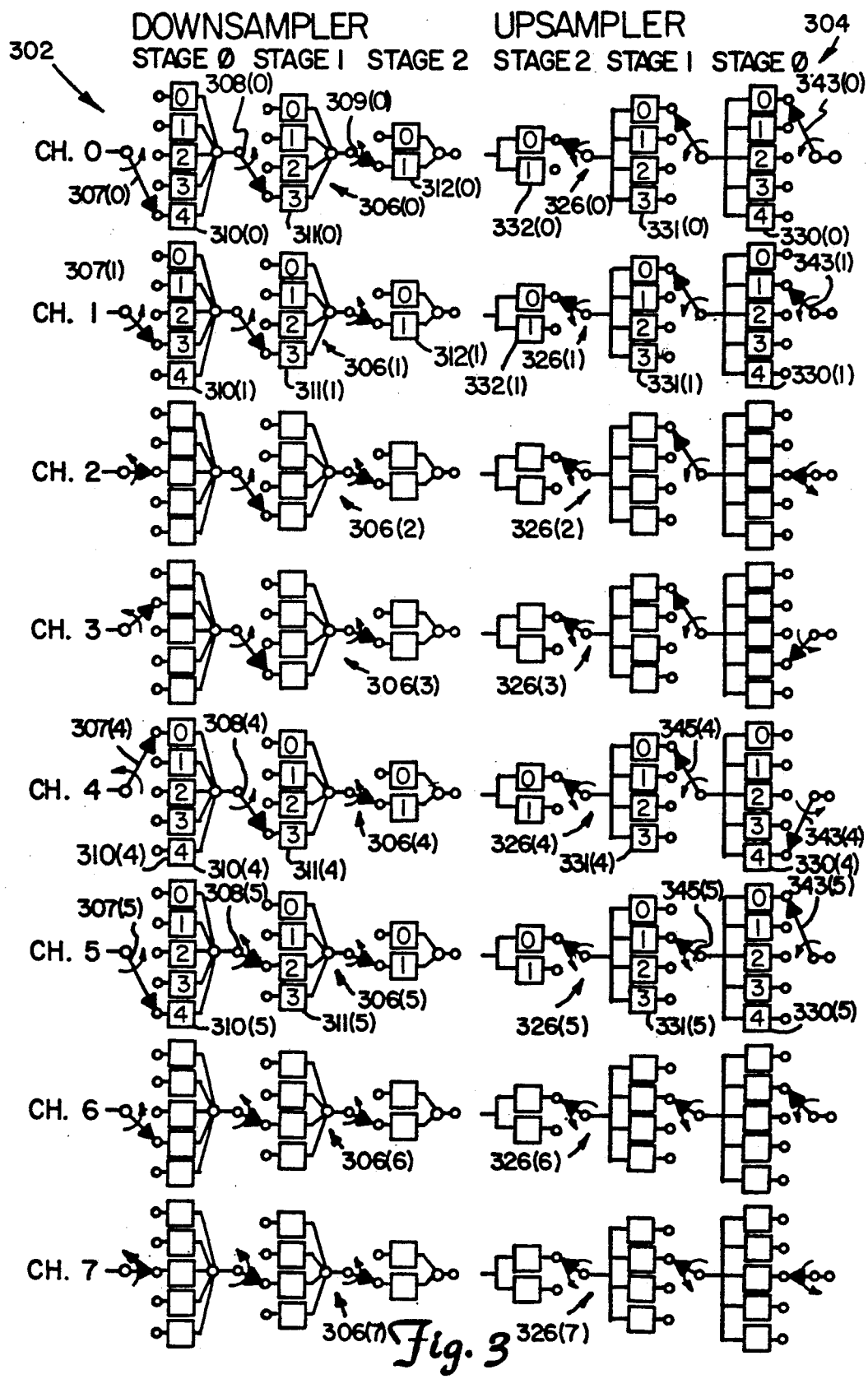
FIG. 3 is a diagram of the initial phase relationship among the commutators for the downsampling and upsampling digital filters executed by a digital signal processor for a plurality of channels.

In the present invention, digital signal processor 26 is programmed to execute digital filters for each incoming data channel with staggered initial commutator settings. Digital signal processor 26 also executes upsampling digital filters for each outgoing control channel, again with the commutator positions being initially staggered. FIG. 3 illustrates a digital filtering arrangement for an 8 channel (channels 0 through 7) arrangement of the commutators of the digital filters at start up, and recurring once each 40 cycles of $F_s$ thereafter. The arrangement of FIG. 3 is merely one of many alternative arrangements, however it is one providing the most nearly constant data processing loading on signal processor 26.

For a downsampling filter, the initial commutator position for stage 0 of a channel is displaced one click relative to adjacent channels. After completing a cycle through the possible initial commutator positions for stage 0, the commutator position in stage i is indexed again and another cycle through the stage 0 commutator positions is begun. Where the number of channels is large enough, and a cycle through the possible initial commutator positions for stage is exhausted, the commutator position for the next subsequent stage is indexed by one click and another cycle through the commutator positions for stage 1 is begun. This pattern is readily extended for an indeterminate plurality of channels and through all stages available. If the number of channels exceeds the combinations of initial commutator positions available, the initial arrangement can be begun again. Staggering the commutator positions in the above manner minimizes the maximum computational load digital signal processor 26 is required to execute in a sampling interval.

An incoming data signal having frequency $F_s$ is applied on each of channels 0–7 into an array 302 of downsampling filters 306(0) through 306(7). Each downsampling filter 306(i) is associated with a particular channel i and decimates or downsamples the signal received over its respective associated channel by a factor of 40 providing an output frequency of $F_s/40$. Commutators rotate counterclockwise. Downsampling filters 306(0), 306(1), 306(4) and 306(5) illustrate the method for the initial commutator positioning of three stages 307(i), 308(i) and 309(i) for an eight channel system. Generally, the initial commutator 307(i) positions for stage 0 of array 302 are displaced one click with each subsequent channel. After completing a cycle through each of the possible initial commutator 307(i) positions for stage 0, the commutator 308($M_o$+1) (where $M_o$ is the number of subfilters in stage 0) position in stage 1 is indexed by one click and another cycle through the commutator positions in stage 0 is begun. A result of staggering the commutator positions is that maximum computational loads for the various channels do not coincide.

An example of commutator positioning at the beginning of a sampling period in stage 0 for filter array 302 is seen between filter 306(0) and filter 306(1). Initially commutator 307(0) in filter 306(0) points to subfilter "4" of stage 310(0). Commutator 307(1) points to subfilter "3" of stage 310(i), a displacement click of relative to the adjacent preceding filter at stage 0.

Commutator positioning in the downstream stages depends upon commutator positions in the stage immediately upstream from the stage for which commutator positions are being set. Stage "0" subfilter sets 310(i) in downsampler array 302 have five subfilters ("0" through "4") each. Thus there are five possible positions for commutators 307. However, there are eight channels, implying that some positions for commutators 307(i) will be repeated.

An example of the adjustment made to initial commutator positioning that occurs when all commutator positions for commutators 307(i) have been used once is seen between filter 306(4), associated with channel "4", and filter 306(5), associated with channel "5". Commutator 308(4) points to subfilter "3" of subfilter set 311(4) in stage "1" of digital filter 306(4). Commutator 308(5) in the next adjacent channel points to subfilter "2" of subfilter set 311(5), a displacement of the commutator by one click. Commutator 307 is shown reset from pointing to subfilter "0" to subfilter "4" from channel "4" to channel "5". One can easily observe that 40 unique combinations of initial commutator position exist for each channel's digital filter.

In the preferred embodiment, commutator phasing is initialized for a channel "c" as though c data points had already passed through the channel. A mathematical formula for initial commutator positioning in a downsampler at stage i of channel c is:

$$\phi_i^c = M_i - 1 - \left[\left(c \text{ div } \prod_{j=0}^{i-1} M_j\right) \bmod M_i\right]$$

for $$0 \leq i \leq N_S - 1$$
$$0 \leq c \leq N_C - 1$$

where $\phi$ is the initial commutator position for channel "c" and stage "i", and $M_j$ is the sampling rate change factor for stage j.

The pattern for positioning of commutators in an upsampling array such as array 304 is analogous to that for a downsampling array. Upsampling array 304 operates on eight channels (0–7) increasing the sampling frequency of the output signal on each channel by a factor of 40. All commutators rotate counterclockwise. The filter 326(i) associated with each channel (i) is preferably identical to the filters for the other channels.

A given filter 326(i) is divided into 3 stages (0–2), corresponding to subfilter sets 330(i), 331(i) and 332(i). The subfilters from each stage, except the last, are connected by a commutator to a subfilter of the next stage. Commutators for stage "0" are displaced by one click with each subsequent channel to obtain reduced peak computational loading of digital signal processor 26 (shown in FIG. 1). Between digital filter 326(0) for channel "0" and digital filter 326(1) for channel "1", commutator 343 is moved from pointing to subfilter "0" of set 330(0) to subfilter "1" of set 330(1).

Commutators for upstream stages can be repositioned if the number of channels exceed the number of stage "0" subfilters. Between filter 326(4) in channel "4" and filter 326(5) in channel "5", commutators for both stage "0" and stage "i" are moved. Commutator 343 is reset from pointing to subfilter "4" of set 330(4) to subfilter "0" of set 330(5). Commutator 345(5) in channel "5" is indexed one position from commutator 345(4) in channel "4", pointing to subfilter "0" of set 331(4) and to subfilter "1" of set 331(5). Again 40 combinations are available.

As with the downsampling array, in the preferred embodiment commutator, phasing is initialized for a channel "c" as though c data points had already passed through the channel. A mathematical formula for the initial commutator positions in an upsampler is:

$$\phi_i^c = \left(c \text{ div } \prod_{j=0}^{i-1} M_j\right) \bmod M_i$$

where $\phi$ is the initial commutator position for channel "c" and stage "i", and $M_j$ is the sampling rate change factor for stage j.

Sampling intervals for which the maximum load generated for each channel occurs will be different. The following table illustrates the distribution of filters executed per interval by channel for the particular case illustrated in FIG. 3.

TABLE I

| Channel | Number of subfilters executed per interval |
| --- | --- |
| 0 | 1111211112111121111311111211112111211113 |
| 1 | 3111121111211112111131111121111211112111113 |
| 2 | 1311112111121111211113111121111211112111113 |
| 3 | 1131112111121111211113111121111211112111113 |
| 4 | 1113111121111211112111311112111112111211113 |
| 5 | 1111311112111121111211113111121111211112111113 |
| 6 | 2111131111211112111121111311112111112111211113 |
| 7 | 1211113111121111211112111131111211112111211113 |

A general formula for the worst case execution time for multiple phased multirate filters for the computator arrangement shown in FIG. 3 is:

$$T = \sum_{i=0}^{N_S-1} \left[ \left( (N_C - 1) \bmod \prod_{j=0}^{i-1} M_j \right) + 1 \right] T_i$$

where $N_c$ is the number of channels, $N_s$ is the number of stages, $M_j$ is the sampling rate change factor for stage j, and $T_i$ is the execution time for a filter of stage i.

Indexing of commutator position for an array of digital filters in the manner set forth above, for either a downsampling array or an upsampling array, introduces a time skew of one sampling period between the sampled data signals being processed on adjacent channels, notwithstanding that the digital filters between channels are identical. It is nonetheless frequently preferable to preserve the timing relationship of the signals on different channels.

Figure 4:
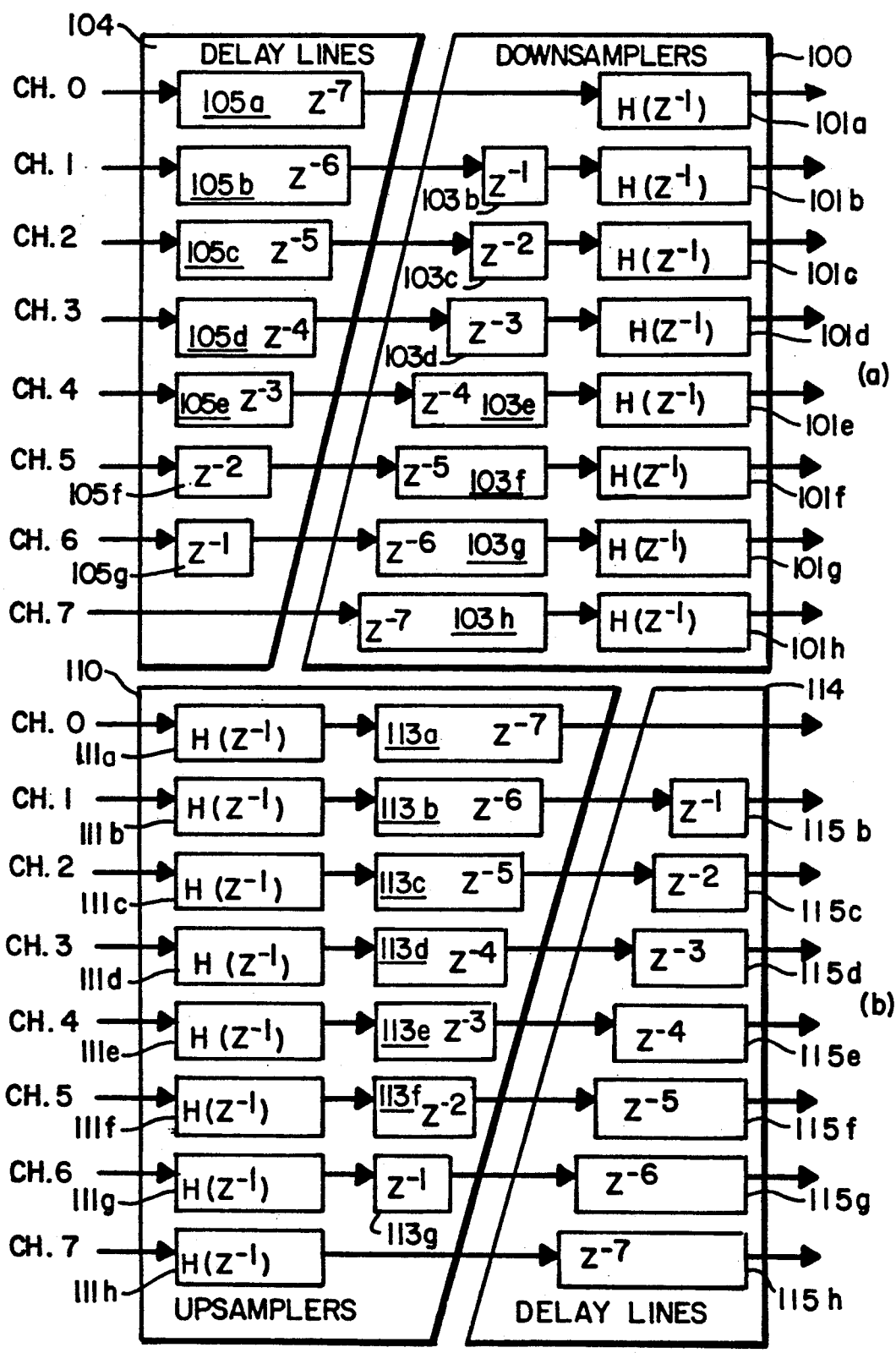
FIG. 4 is a diagram of the relationship among deskewing delay lines for the channels of the FIG. 3.

FIG. 4 illustrates timing relationships and timing compensation between channels. Downsampler array 100 accepts 8 data signals on channels 0–7, each of which signals is directed to a different downsampling or decimation filter 101a–101h, respectively. Downsampling filters 101b–101h are associated with signal delays 103b–103h, resulting from each filter being phase staggered as against the filter for the immediately preceding channel. An array 104 of delay lines 105a–105g are disposed in channels 0–6 to eliminate the skew between channels 0–7.

Deskewing for upsampler array 110 is analogous. Delays 113a–113g are associated with interpolation filters 111a–111g. Accordingly, delay line array 114 includes delay lines 115b–115h associated with channels "1"–"7" to eliminate the skew between channels 0–7.

The present invention provides for digital filtering of multiple channels. The common algorithm is modified so that the processor can actually digitally process more channels then before. The algorithm increases the mean number of computations that the digital signal processor executes, while reducing the peak number of computations and accordingly drives the processor closer to its theoretical maximum operating rate. In the application described above, the method of the invention has increased the number of channels a digital signal processor can process almost threefold over the prior art techniques.

Although the present invention has been described with reference to preferred embodiments, workers skilled in the art will recognize that changes may be made in form and detail without departing from the spirit and scope of the invention.

What is claimed is:

1. A method for converting signals on a plurality of parallel channels from a first sampling frequency to a second sampling frequency by a digital signal processor, the method comprising:
   providing a substantially identical multistage, multirate digital filter for each channel, the filters being in parallel and each stage of each multistage, multirate digital filter including a plurality of subfilters and a commutator indicating a subfilter for execution;
   staggering initial commutator positions between the multistage, multirate digital filters at a highest rate stage to avoid coincidence of execution of subfilters between the plurality of multistage, multirate digital filers;
   thereafter applying the signal on each channel to the respective multistage, multirate digital filter for the channel;
   indexing the commutators at the same stage of each multistage, multirate digital filters at the same frequency; and
   executing the indicated subfilter with each indexation of its respective commutator.

2. The method of claim 1 and further comprising:
   indexing the commutator for second highest rate stage of each multistage, multirate digital filer upon execution of the last filter subfilter in the highest rate stage; and
   staggering initial commutator positions in the second highest rate stages as a function of cummutator positions for the highest rate stage.

3. The method of claim 1 and further comprising:
   indexing the commutator for each subsequently lower rate stage of each multistage, multirate digital filter upon execution of the last filter subfilter in an adjacent higher rate stage; and
   staggering initial commutator positions in each subsequently lower rate stage as a function of commutator positions for the adjacent higher rate stage.

4. The method of claim 3 and further comprising:
   delaying the signals on selected channels to compensate for phase skewing between the signals on different
   where $\phi_i^c$ is the initial commutator position for stage i of channel c, $N_s$ is the number of stages, $N_c$ is the number of channels, $M_j$ is the sampling rate change factor for stage j, and $M_i$ is the sampling rate change factor for stage i. channels introduced by the staggered commutator positions.

5. The method of claim 3 wherein staggering the initial commutator positions further includes displacing by one step the commutator of the highest rate stage for each multirate, multistage digital filter by one relative to the highest rate stage of an adjacent channel's multirate, multistage digital filter.

6. The method of claim 4 wherein staggering the initial position of commutators for parallel downsampling multirate, multistage digital filters further includes setting the positions of the commutators as indicated by the formula $$\phi_i^c = M_i - 1 - \left[ \left( c \operatorname{div} \prod_{j=0}^{i-1} M_j \right) \bmod M_i \right]$$

$$\text{for } \begin{array}{l} 0 \leq i \leq N_s - 1 \\ 0 \leq c \leq N_c - 1 \end{array}$$

where $\phi_i^c$ is the initial commutator position for stage i of channel c, $N_s$ is the number of stages, $N_c$ is the number of channels, $M_j$ is the sampling rate change factor for stage j, and $M_i$ is the sampling rate change factor for stage i.

7. The method of claim 2 wherein the delay interval in each channel is a function of the initial commutator positions in the filter for that channel.

8. The method of claim 4 wherein staggering the initial commutator positions for parallel unsampling multirate, multistage digital filters further includes setting commutator positions as indicated by the formula $$\phi_i^c = \left( c \text{ div} \prod_{j=0}^{i-1} M_j \right) \bmod M_i$$

for $$0 \leq i \leq N_S - 1$$
$$0 \leq c \leq N_C - 1$$

where $\phi_i^c$ is the initial commutator position for stage i of channel c, $N_s$ is the number of stages, $N_c$ is the number of channels, $M_j$ is the sampling rate change factor for stage j, and $M_i$ is the sampling rate change factor for stage i.

9. The method of claim 8 wherein the delay interval for each channel is a function of the commutator positions in the multirate, multistage digital filter for the channel.

10. The method of claim 9 wherein staggering the initial position of commutators for parallel downsampling multirate, multistage digital filters further includes setting the positions of commutators as indicated by the formula $$\phi_i^c = M_i - 1 - \left[ \left( c \text{ div} \prod_{j=0}^{i-1} M_j \right) \bmod M_i \right]$$

for $$0 \leq i \leq N_S - 1$$
$$0 \leq c \leq N_C - 1$$

where $\phi_i^c$ is the initial commutator position for stage i of channel c, $N_s$ is the number of stages, $N_c$ is the number of channels, $M_j$ is the sampling rate change factor for stage j, and $M_i$ is the sampling rate change factor for stage i.

11. The method of claim 1 wherein staggering the initial commutator positions for parallel upsampling digital filters further include setting commutator positions as indicated by the formula $$\phi_i^c = \left( c \text{ div} \prod_{j=0}^{i-1} M_j \right) \bmod M_i$$

for $$0 \leq i \leq N_S - 1$$
$$0 \leq c \leq N_C - 1$$

$\phi_i^c$ is the initial commutator position for stage i of channel c, $N_s$ is the number of stages, $N_c$ is the number of channels, $M_j$ is the sampling rate change factor for stage j, and $M_i$ is the sampling rate change factor for stage i.

12. In a digital signal processor receiving a plurality of digital data signals, and being programmed to process each digital data signal through a multistage, multirate digital filter, each stage including a plurality of subfilters and a commutator indicating a particular subfilter for execution, the commutator of a first stage being indexed once each sampling period and the commutators of subsequent stages being indexed by cycling of the commutator of a preceding adjacent stage through all of the subfilters of the preceding adjacent stage, a method for reducing peak computational loading in the digital signal processor comprising the steps of:

initially positioning commutator positions in the first stage of the digital filters for each channel by displacing the commutators by one click relative to the commutator positions in adjacent channels; and initially positioning commutator positions in a given downstream stage by indexing the commutator positions by one for each cycle through the possible initial commutator positions for a stage next upstream from the given downstream stage 0.

* * * * *

UNITED STATES PATENT AND TRADEMARK OFFICE
CERTIFICATE OF CORRECTION

PATENT NO. : 5,068,813

DATED : November 26, 1991

INVENTOR(S) : Bradford K. Thoen

It is certified that error appears in the above-identified patent and that said Letters Patent is hereby corrected as shown below:

Col. 10, line 15, delete "cummutator" and insert -- commutator --.

Col. 10, lines 27-28, after "different", insert -- channels introduced by the staggered commutator positions --.

Col. 10, delete lines 29-34.

Col. 10, line 50, delete "$\varnothing_i^c$" and insert -- $\varnothing_i^c$ --.

Col. 10, line 57, delete "$\varnothing_i^c$" and insert -- $\varnothing_i^c$ --.

Col. 11, line 3, delete "$\varnothing_i^c$" and insert -- $\varnothing_i^c$ --.

Col. 11, line 21, delete "claim 9" and insert -- claim 1 --.

Col. 11, line 28, delete "$\varnothing_i^c$" and insert -- $\varnothing_i^c$ --.

Col. 11, line 36, delete "$\varnothing_i^c$" and insert -- $\varnothing_i^c$ --.

Col. 12, line 8, delete "$\varnothing_i^c$" and insert -- $\varnothing_i^c$ --.

UNITED STATES PATENT AND TRADEMARK OFFICE
CERTIFICATE OF CORRECTION

PATENT NO. : 5,068,813

DATED : November 26, 1991

INVENTOR(S) : Bradford K. Thoen

It is certified that error appears in the above-identified patent and that said Letters Patent is hereby corrected as shown below:

Col. 12, line 15, delete "$\emptyset_i^c$" and insert --where $\emptyset_i^c$ --.

Signed and Sealed this

Sixteenth Day of March, 1993

Attest:

STEPHEN G. KUNIN

*Attesting Officer*     Acting Commissioner of Patents and Trademarks